(12) United States Patent
Cannon et al.

(10) Patent No.: US 7,651,902 B2
(45) Date of Patent: Jan. 26, 2010

(54) HYBRID SUBSTRATES AND METHODS FOR FORMING SUCH HYBRID SUBSTRATES

(75) Inventors: Ethan Harrison Cannon, Essex Junction, VT (US); Toshiharu Furukawa, Essex Junction, VT (US); John Gerard Gaudiello, Poughkeepsie, NY (US); Mark Charles Hakey, Fairfax, VT (US); Steven John Holmes, Guilderland, NY (US); David Vaclav Horak, Essex Junction, VT (US); Charles William Koburger, III, Delmar, NY (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 11/737,989

(22) Filed: Apr. 20, 2007

(65) Prior Publication Data

US 2008/0258181 A1    Oct. 23, 2008

(51) Int. Cl.
*H01L 21/338* (2006.01)
*H01L 23/62* (2006.01)
(52) U.S. Cl. ............... 438/199; 438/311; 438/479; 257/347; 257/E21.632
(58) Field of Classification Search ........... 438/199, 438/311, 479, 967; 257/E21.632
See application file for complete search history.

(56) References Cited

U.S. PATENT DOCUMENTS

| | | | |
|---|---|---|---|
| 4,169,000 A | 9/1979 | Riseman | |
| 5,480,832 A | 1/1996 | Miura et al. | |
| 6,273,949 B1 | 8/2001 | Eyres et al. | |
| 6,635,534 B2 | 10/2003 | Madson | |
| 6,830,962 B1 | 12/2004 | Guarini et al. | |
| 7,329,923 B2 | 2/2008 | Doris et al. | |
| 7,435,639 B2 * | 10/2008 | Winstead et al. | ............ 438/199 |
| 2002/0006715 A1 | 1/2002 | Chhagan et al. | |
| 2005/0030780 A1 | 2/2005 | Deppe et al. | |
| 2005/0116290 A1 * | 6/2005 | de Souza et al. | ............ 257/347 |
| 2005/0280121 A1 | 12/2005 | Doris et al. | |
| 2006/0024931 A1 | 2/2006 | Chan et al. | |
| 2006/0105507 A1 | 5/2006 | Ieong et al. | |
| 2006/0113605 A1 | 6/2006 | Currie | |
| 2006/0231893 A1 | 10/2006 | Bernstein et al. | |

(Continued)

OTHER PUBLICATIONS

IBM Patent Application, U.S. Appl. No. 11/155,030, entitled "Coplanar Silicon-On-Insulator (SOI) Regions of Different Cyrstal Orientations and Methods of Making the Same," filed Jun. 16, 2005 by Louis Hsu et al.

(Continued)

*Primary Examiner*—Marcos D. Pizarro
*Assistant Examiner*—Steven H Rao
(74) *Attorney, Agent, or Firm*—Wood, Herron & Evans, LLP

(57) ABSTRACT

Hybrid substrates characterized by semiconductor islands of different crystal orientations and methods of forming such hybrid substrates. The methods involve using a SIMOX process to form an insulating layer. The insulating layer may divide the islands of at least one of the different crystal orientations into mutually aligned device and body regions. The body regions may be electrically floating relative to the device regions.

7 Claims, 10 Drawing Sheets

U.S. PATENT DOCUMENTS

2007/0015346 A1 1/2007 Cohen et al.
2007/0281446 A1* 12/2007 Winstead et al. ............ 438/478

OTHER PUBLICATIONS

IBM Patent Application, U.S. Appl. No. 11/154,907, entitled "Crystal Imprinting Methods for Fabricating Substrates with Thin Active Silicon Layers," filed Jun. 16, 2005 by Louis Hsu et al.

IBM Patent Application, U.S. Appl. No. 11/218,198, entitled "Method and Apparatus for Making Coplanar Dielectrically-Isolated Regions of Different Semiconductor Materials on a Substrate," filed Sep. 1, 2005 by Howard H. Chen et al.

Rao, Shrinivas H. (Examiner), US Patent and Trademark Office, Office Action issued in related U.S. Appl. No. 11/877,871 dated Oct. 14, 2008 (6 pages).

* cited by examiner

HYBRID SUBSTRATES AND METHODS FOR FORMING SUCH HYBRID SUBSTRATES

FIELD OF THE INVENTION

The invention relates generally to semiconductor substrates and fabrication methods and, more particularly, to hybrid substrates and semiconductor structures with device regions of different crystal orientations and methods for forming such hybrid substrates and semiconductor structures.

BACKGROUND OF THE INVENTION

Devices fabricated using silicon-on-insulator (SOI) substrates provide certain performance improvements, such as lower parasitic junction capacitance, in comparison with comparable devices built directly in a bulk silicon substrate. Generally, SOI substrates include a thin active layer of silicon partitioned into discrete electrically-isolated device regions for devices and a thin buried layer of an insulator, such as silicon dioxide ($SiO_2$), electrically isolating the active layer from the rest of the substrate. Traditional field effect transistors (FETs) feature source and drain regions formed within the active layer of the SOI substrate, a channel region in the active layer that is disposed between the source and drain regions, and a gate overlying the channel region. A voltage applied to the gate regulates the current flowing from the source region through the channel region to the drain region.

Complementary metal-oxide-semiconductor (CMOS) circuits include n-channel field effect transistors (nFETs), in which electron carriers are responsible for conduction in the channel region, and p-channel field effect transistors (pFETs), in which hole carriers are responsible for conduction in the channel region. CMOS circuits are typically fabricated on silicon wafers having a single crystal orientation, ordinarily a (100) crystal orientation. Electrons have a higher mobility in silicon characterized by a (100) crystal orientation in comparison with a (110) crystal orientation. In contrast, holes have higher mobility in silicon characterized by a (110) crystal orientation in comparison with a (100) crystal orientation.

In recognition of this ability to optimize device performance, hybrid orientation technology (HOT) has evolved to produce hybrid SOI substrates characterized by device regions of different crystal orientations. CMOS circuits can be fabricated using such hybrid SOI substrates with nFETs formed in silicon device regions of a (100) crystal orientation and pFETs formed in silicon device regions of a (110) crystal orientation. Consequently, the device performance of each device type in the CMOS circuit can be individually optimized.

Despite the development of such hybrid SOI substrates, improvements are needed to further optimize the performance of CMOS circuits including nFETs and pFETs carried by hybrid SOI substrates.

SUMMARY OF THE INVENTION

An embodiment of the invention is directed to a semiconductor structure comprising a semiconductor layer carried on a substrate, a first insulating layer between the semiconductor layer and the substrate, and a second insulating layer at least partially between the first insulating layer and the substrate. The semiconductor layer comprises a plurality of first device regions having a first crystal orientation and a plurality of second device regions having a second crystal orientation differing from the first crystal orientation. The semiconductor structure further comprises a plurality of first body regions of semiconductor material between the first and second insulating layers and a plurality of dielectric regions extending through the semiconductor layer to the first insulating layer. Each of the dielectric regions is disposed between one of the first device regions and one of the second device regions. Each of the dielectric regions further extends from the first insulating layer to the second insulating layer. Adjacent pairs of the dielectric regions bound one of the first body regions so that each of the first body regions is aligned with a respective one of the first device regions.

In another embodiment of the invention, a method of forming a semiconductor structure comprises bonding a first semiconductor layer of a first crystal orientation with a second semiconductor layer of a second crystal orientation differing from the first crystal orientation to define an interface. Openings are defined that have sidewalls extending from a top surface of the first semiconductor layer to the second semiconductor layer and dielectric regions are applied to the sidewalls of each of the openings. The method further comprises epitaxially growing an island of semiconductor material having the second crystal orientation of the second semiconductor layer to fill each of the openings. Oxygen-containing ions are implanted into the bonded first and second semiconductor layers to form an oxygen concentration profile either overlapping the interface or between the interface and the top surface of the first semiconductor layer. The method further comprises heating the oxygen concentration profile, the first semiconductor layer, and the epitaxially grown islands at a high temperature to form a first insulating layer comprising oxygen from the oxygen concentration profile and material from at least one of the first semiconductor layer and the epitaxially grown islands.

In another embodiment of the invention, a method of forming a semiconductor structure comprises bonding a first dielectric layer carried on a first semiconductor layer of a first crystal orientation with a second dielectric layer carried on a second semiconductor layer of a second crystal orientation differing from the first crystal orientation. Openings are defined that have sidewalls extending from a top surface of the first semiconductor layer through the first and second dielectric layers to the second semiconductor layer and dielectric regions are applied to the sidewalls of each of the openings. The method further comprises epitaxially growing an island of semiconductor material having the second crystal orientation of the second semiconductor layer to fill each of the openings. An insulating layer is formed at a depth that divides the first semiconductor layer into a plurality of device regions between the insulating layer and the top surface and a plurality of body regions between the insulating layer and the first and second dielectric layers such that each of the body regions is aligned with one of the device regions between an adjacent pair of the dielectric regions.

In another embodiment of the invention, a method is provided for forming a semiconductor structure using a semiconductor layer comprising a juxtaposed plurality of islands of at least two different crystal orientations. The islands are substantially co-planar and of substantially equal thicknesses. Adjacent islands are separated by one of a plurality of dielectric regions. The method comprises bonding a first dielectric layer carried on the semiconductor layer with a second dielectric layer carried on a handle substrate. The semiconductor layer is transferred to the handle substrate. The method further comprises forming an insulating layer that divides each of the islands into a device region between the insulating layer and a top surface of the transferred semiconductor layer and a body region between the insulating layer and the first and second dielectric layers such that each of the body regions is aligned with one of the device regions between an adjacent pair of the dielectric regions.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
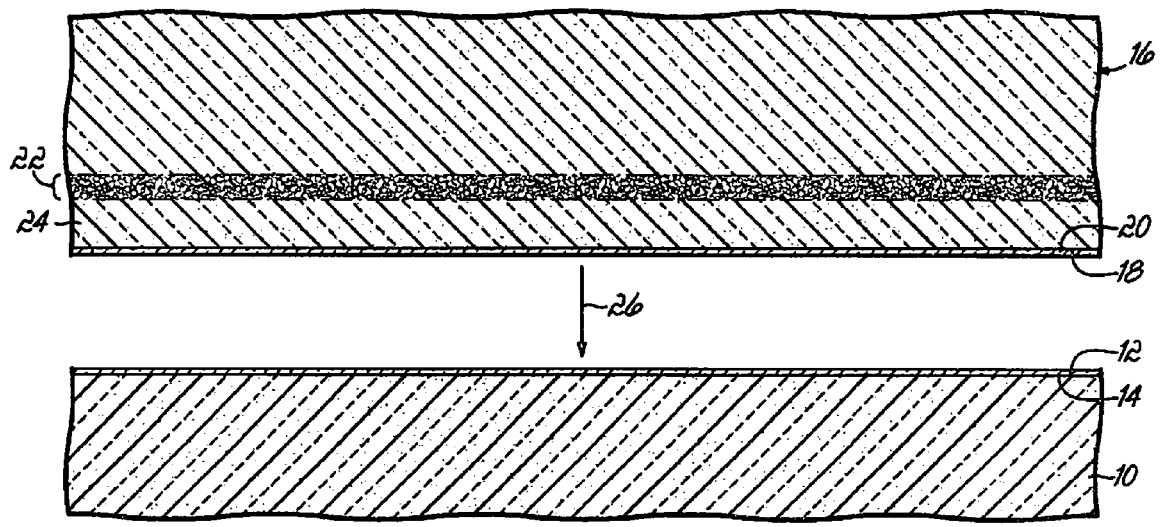
FIGS. 1-7 are diagrammatic cross-sectional views of a portion of a substrate at successive fabrication stages of a processing method in accordance with an embodiment of the invention.

With reference to FIG. 1, a first substrate 10 includes a top surface 12 covered by a relatively thin dielectric layer 14. A second substrate 16 includes a top surface 18 covered by a relatively thin dielectric layer 20. The top surfaces 12, 18 are preferably mechanically smooth to promote good surface-to-surface contact when the dielectric layers 14, 20 have a contacting relationship. The first and second substrates 10, 16 are each formed from a single crystal or monocrystalline semiconductor material, such as monocrystalline silicon.

The crystal orientations of the first and second substrates 10, 16 differ in that the first substrate 10 has a first crystal orientation with crystal planes identified by Miller indices (j,k,l) and the second substrate 16 has a second crystal orientation with crystal planes identified by Miller indices (j',k',l') that differs from the first crystal orientation (j,k,l). For monocrystalline silicon, the respective crystal orientations (j,k,l), (j',k',l') of the first and second substrates 10, 16 may be selected from (100), (110) and (111). For example, the first crystal orientation (j,k,l) may be a (100) crystal orientation and the second crystal orientation (j',k',l') may be a (110) crystal orientation. It is understood by a person having ordinary skill in the art that the first crystal orientation (j,k,l) extends to a given depth from the top surface 12 into the first substrate 10. It also is understood by a person having ordinary skill in the art that the second crystal orientation (j',k',l') extends to a given depth from the top surface 18 into the second substrate 16. As a result, the first and second substrates 10, 16 exhibit a periodic spatial arrangement of atoms with long-range order throughout the entire monolithic piece of crystalline semiconductor material.

The dielectric materials composing dielectric layers 14, 20 may be characterized by a dielectric constant between about four (4) and about nine (9), such as silicon dioxide ($SiO_2$), silicon nitride ($Si_3N_4$), silicon oxynitride ($SiO_xN_y$), or composites of these materials. The dielectric layers 14, 20 may comprise $SiO_2$ formed by thermal wet or dry oxidation of the respective substrates 10, 16. Alternatively, any other suitable technique, such as chemical vapor deposition (CVD) or aqueous chemical oxidation, may be used for forming the dielectric layers 14, 20. Dielectric layers 14, 20 may each have a physical thickness of about one-half (0.5) nm to about two (2) nm and a flat, smooth surface finish. Optionally, the dielectric layers 14, 20 may be planarized by, for example, a conventional chemical mechanical polishing (CMP) process to be approximately flat and smooth.

The second substrate 16 is ion implanted using a conventional ion implantation process with hydrogen ions, or other rare gas ions, of relatively low energy to create a shallow and narrow damaged region or band 22. The damaged band 22, after a suitable thermal treatment, defines a cleaving plane promoting subsequent separation of a semiconductor layer 24 generally between damaged band 22 and dielectric layer 20. The kinetic energy of the implanted hydrogen or rare gas ions is selected to provide a projected range of the ions in the damaged band 22 such that the cleaved semiconductor layer 24 has a thickness ranging from about five (5) nm to about two hundred (200) nm relative to the top surface 18. The stopped hydrogen or other rare gas will reside predominantly across the damaged band 22 in a profile with a varying concentration as a function of depth below top surface 18 and a peak concentration at a depth beneath top surface 18 roughly centered about the average penetration depth of the ions. Exemplary processes for forming the damaged band 22 and the subsequent cleaving along the damaged band 22 include the Smart Cut® process recognized by a person having ordinary skill in the art as a conventional technique used to fabricate bonded SOI substrates, and the process described in U.S. Pat. Nos. 5,374,564 and 5,882,987, the disclosure of each of which is hereby incorporated by reference herein in its entirety.

Figure 2:
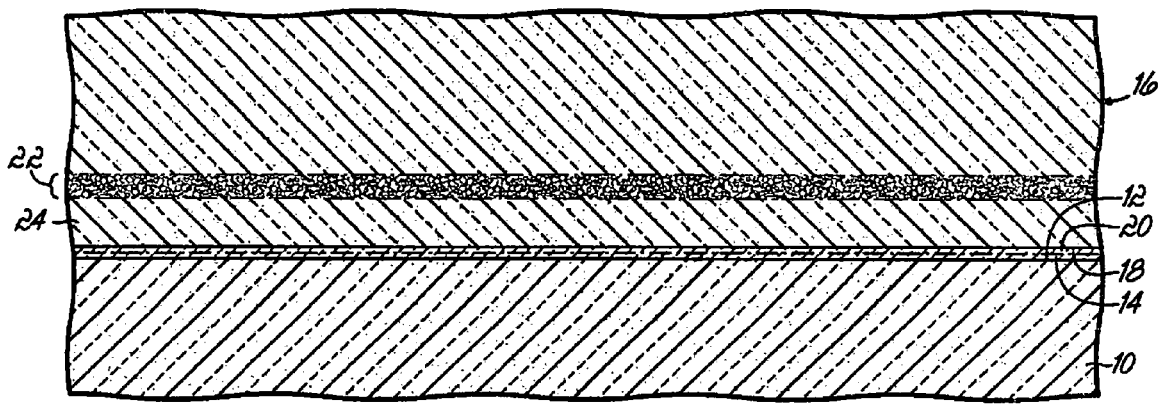

With reference to FIG. 2 in which like reference numerals refer to like features in FIG. 1 and at a subsequent fabrication stage, the substrates 10, 16 are maneuvered such that the dielectric layer 14 carried on the top surface 12 of the first substrate 10 contacts with the dielectric layer 20 carried on the top surface 18 of the second substrate 16, as indicated diagrammatically by the single headed arrow 26 (FIG. 1), to provide the contacting relationship shown in FIG. 2. The substrates 10, 16 are then bonded together by a conventional bonding process that exposes the dielectric layers 14, 20 to conditions that are capable of enhancing their mutual bonding energy.

A typical conventional bonding process involves a low temperature thermal treatment or anneal at a sufficient temperature and for a sufficient duration to cause bonding between the dielectric layers 14, 20. For example, the bonding process may be conducted by annealing the contacting dielectric layers 14, 20 at a temperature ranging from about 500° C. to about 800° C. Optionally, the first and second substrates 10, 16 may be clamped together during the thermal anneal by an external force applying mechanical pressure typically between about 2 kg/cm² and about 2.5 kg/cm². The thermal anneal, which may be performed in the presence or absence of an external force, is also typically performed in a controlled atmosphere consisting of a non-reactive gas, such as nitrogen ($N_2$), or an inert gas.

Figure 3:
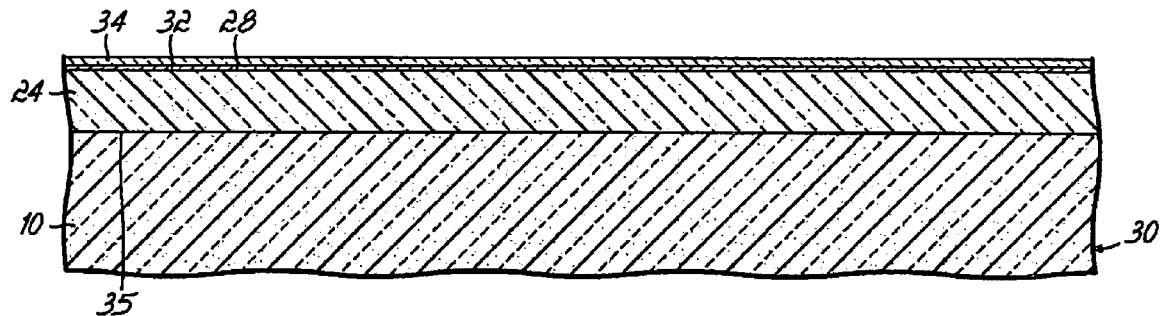

With reference to FIG. 3 in which like reference numerals refer to like features in FIG. 2 and at a subsequent fabrication stage, the bonded substrates 10, 16 are thermally treated at a temperature greater than the temperature of the preceding thermal treatment (FIG. 2). The thermal treatment or anneal may be conducted in an inert atmosphere at a temperature in the range of about 700° C. to about 1100° C. and for a duration adequate to cause the hydrogen, or other rare gas, in the damaged band 22 to coalesce into microvoids localized within the damaged band 22. Upon cooling from the annealing temperature, stresses associated with the microvoids formed in the damaged band 22 may spontaneously cause separation along a cleaving plane defined generally by the damaged band 22. Cleavage along the damaged band 22 may be mechanically assisted by, for example, the use of a water jet to initiate a fracture that propagates across the damaged band 22.

After separation occurs, the semiconductor layer 24 of the second crystal orientation (j',k',l') is carried on the substrate 10 of the first crystal orientation (j,k,l), which operates as a handle wafer. The semiconductor layer 24 has a top surface 28 after separation along the cleaving plane. The top surface 28 is planarized and polished by, for example, a conventional CMP process to be approximately flat and smooth to provide a hybrid substrate 30.

The hybrid substrate 30 is annealed in an inert atmosphere and at a temperature greater than the temperature of the preceding thermal treatments to dissolve the contacting dielectric layers 14, 20. For example, the hybrid substrate 30 may be annealed at a temperature in a range of about 1300° C. to 1350° C. The constituent material of the dielectric layers 14, 20 is atomically dispersed into the bulk of the hybrid substrate 30 by a diffusion mechanism. The semiconductor layer 24 is coextensive with the semiconductor material of substrate 10 along an interface 35 defined near the former location of the contacting dielectric layers 14, 20 and, thus, the former location of top surfaces 12, 18.

A first pad layer 32 is formed on the top surface 28 of semiconductor layer 24. A second pad layer 34 is formed on the first pad layer 32. The thinner first pad layer 32 separates the second pad layer 34 from the substrate layer 24. The constituent material(s) of pad layers 32, 34 are chosen to etch selectively to the semiconductor material constituting semiconductor layer 24 and to be easily removed at a future stage of the fabrication process. The first pad layer 32 may be $SiO_2$ grown by exposing substrate 30 to either a dry oxygen ambient or steam in a heated environment or deposited by a thermal CVD process. The second pad layer 34 may be a conformal layer of $Si_3N_4$ formed by a thermal CVD process like low-pressure chemical vapor deposition (LPCVD) or a plasma-assisted CVD process. The first pad layer 32 may operate as a buffer layer to prevent any stresses in the material constituting the second pad layer 34 from causing dislocations in the semiconductor material of semiconductor layer 24.

Figure 4:
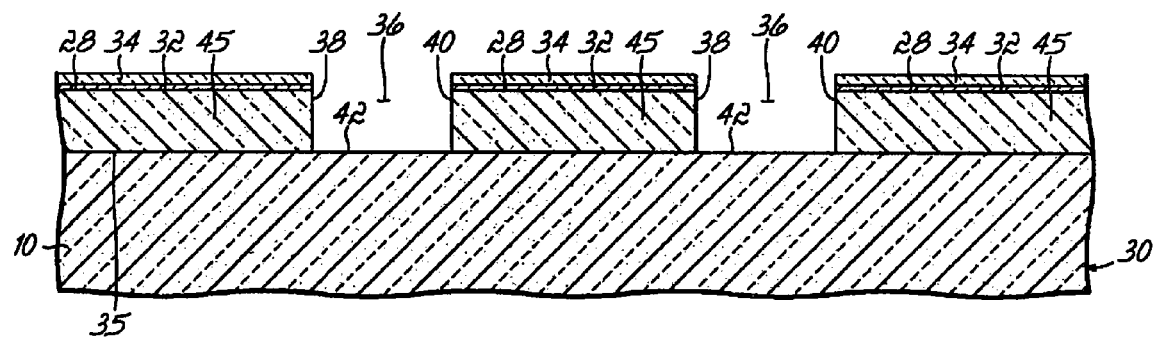

With reference to FIG. 4 in which like reference numerals refer to like features in FIG. 3 and at a subsequent fabrication stage, openings 36 are defined as windows extending through the thickness of semiconductor layer 24 by a conventional lithography and subtractive etching process that utilizes a pattern imparted in the pad layers 32, 34. The openings 36 may have the form of shallow trenches. The pattern may be created in the pad layers 32, 34 by applying a resist (not shown) on pad layer 34, exposing the resist to a pattern of radiation to create a latent pattern in the resist, and developing the latent pattern in the exposed resist. An anisotropic dry etching process, such as reactive-ion etching (RIE) or plasma etching, may then be used to transfer the pattern from the patterned resist into the pad layers 32, 34. The etching process, which may be conducted in a single etching step or multiple etching steps with different etch chemistries, removes portions of the pad layers 32, 34 visible through the pattern in the patterned resist and stops vertically on the top surface 28 of semiconductor layer 24. After etching is concluded, residual resist is stripped from the pad layers 32, 34 by, for example, plasma ashing or a chemical stripper.

The pattern is then transferred from the patterned pad layers 32, 34 into the underlying semiconductor layer 24 with an anisotropic dry etching process. The anisotropic dry etching process may be constituted by, for example, RIE, ion beam etching, or plasma etching using an etch chemistry (e.g., a standard silicon RIE process) that removes the constituent semiconductor material of semiconductor layer 24 selective to (i.e., with a significantly greater etch rate than) the materials constituting the pad layers 32, 34.

Each of the openings 36 defined in the semiconductor material of semiconductor layer 24 includes opposite sidewalls 38, 40 that extend into layer 24 to a bottom surface or base 42 that is at, or below, the interface 35 between the semiconductor layer 24 and the first substrate 10. The sidewalls 38, 40 are substantially mutually parallel and are oriented substantially perpendicular to the top surface 28 of semiconductor layer 24 and to the interface 35. At the conclusion of the conventional lithography and subtractive etching process, the semiconductor layer 24 includes a plurality of islands 45 of semiconductor material having the crystal orientation of the semiconductor material of the cleaved substrate 16 (FIGS. 1, 2). Adjacent islands 45 are separated by one of the openings 36.

Figure 5:
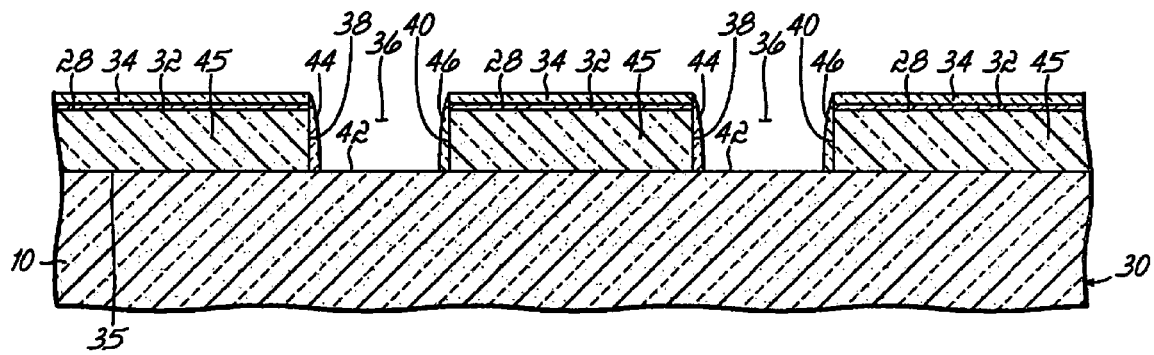

With reference to FIG. 5 in which like reference numerals refer to like features in FIG. 4 and at a subsequent fabrication stage, dielectric spacers 44, 46 are formed on the sidewalls 38, 40 of each opening 36. The dielectric spacers 44, 46 may originate from a conformal layer (not shown) of a dielectric material, such as about five (5) nm to about fifty (50) nm conformal layer of $Si_3N_4$ deposited by CVD, that is shaped by a directional anisotropic etching process that preferentially removes the conformal layer from horizontal surfaces.

Figure 6:
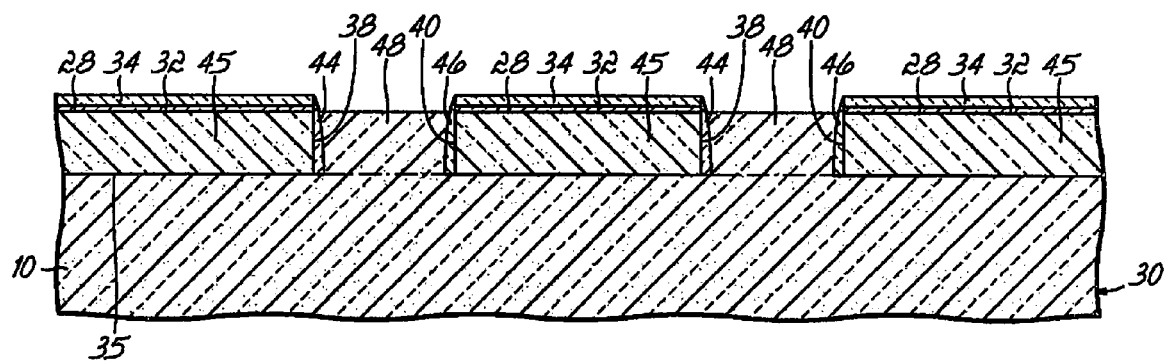

With reference to FIG. 6 in which like reference numerals refer to like features in FIG. 5 and at a subsequent fabrication stage, the openings 36 are filled with epitaxial islands 48 of semiconductor material to establish a top surface 50 approximately level with the top surface 28 of the semiconductor layer 24. The monocrystalline semiconductor material of the substrate 10 operates as a seed crystal of single crystal material that sets a crystallographic pattern for the grown silicon in openings 36 in which this crystallographic pattern is reproduced. In other words, the monocrystalline semiconductor material of the islands 48 will have the same crystal orientation as the crystal orientation (j,k,l) of the monocrystalline semiconductor material of the substrate 10. The pad layers 32, 34 and dielectric spacers 44, 46 on the sidewalls 38, 40 of each opening 36 isolate the epitaxial islands 48 such that the resulting crystal orientation of the islands 48 is unaffected during deposition by the crystal orientation of the semiconductor layer 24.

The epitaxial islands 48 may be composed of silicon formed by a selective epitaxial growth (SEG) process, which is performed at sub-atmospheric process pressures and with a substrate temperature between about 500° C. and about 1050° C. Silicon sources for the SEG process may include, but are not limited to, silicon tetrachloride ($SiCl_4$), trichlorosilane ($SiHCl_3$), and dichlorosilane ($SiH_2Cl_2$). Typical SEG process conditions include a sub-atmospheric source pressure of about 40 Torr and a substrate temperature of about 900° C. The epitaxial islands 48 may be doped in situ by adding a dopant to the silicon source during deposition of the epitaxial semiconductor material or may include amounts of another element, such as germanium (Ge).

Figure 7:
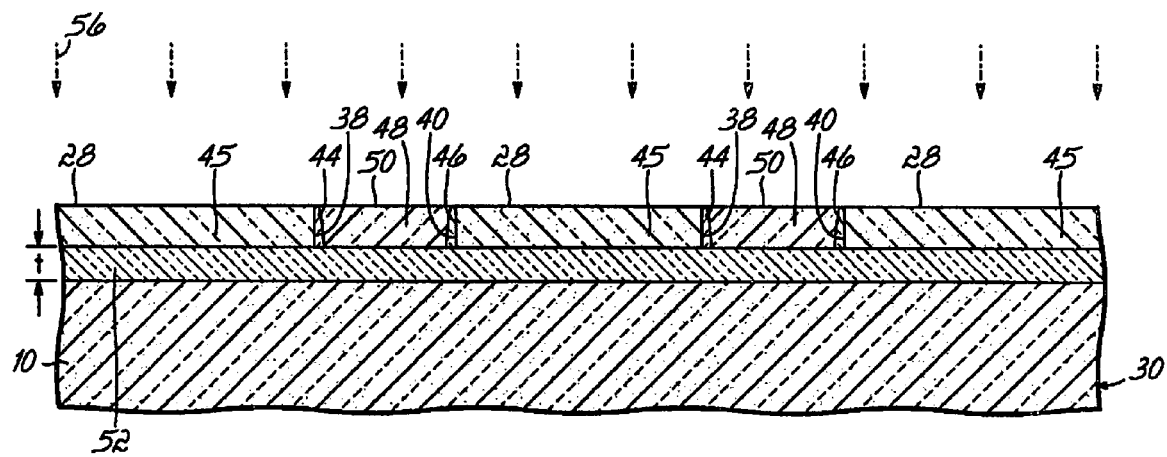

With reference to FIG. 7 in which like reference numerals refer to like features in FIG. 6 and at a subsequent fabrication stage, the top surface 50 of each of the epitaxial islands 48 and the top surface 28 of the islands 45 are planarized with a conventional planarization process, such as a CMP process, to be substantially coplanar. Each set of dielectric spacers 44, 46 operates to laterally isolate one of the epitaxial islands 48 from adjacent islands 45 of semiconductor material associated with semiconductor layer 24. The planarization process also removes the pad layers 32, 34 from the top surface 28 of islands 45, although a separate wet chemical etch process may be used that removes the materials of the pad layers 32, 34 selective to the semiconductor materials constituting the islands 45, 48. For example, the wet chemical etch process may entail sequentially exposing the pad layers 32, 34 to a heated etchant solution of phosphoric acid to remove nitride and an etchant solution of hydrofluoric acid to remove oxide.

The islands 45 have a crystal orientation determined by the crystal orientation (j',k',l') of the second substrate 16. The epitaxial islands 48 have a crystal orientation determined by the crystal orientation (j,k,l) of the first substrate 10. Each of the islands 45 may have a crystal orientation selected from (100), (110) and (111) crystal orientations common to monocrystalline silicon. Each of the epitaxial islands 48 may have a crystal orientation different from the crystal orientation of islands 45 and selected from (100), (110) and (111) crystal orientations common to monocrystalline silicon.

A buried insulating layer 52 of a given thickness, t, is formed that overlaps the depth of the interface 35 so that the epitaxial islands 48 and the islands 45 of semiconductor material associated with semiconductor layer 24 are electrically isolated from substrate 10, which now operates as a handle wafer for the hybrid substrate 30. The buried insulating layer 52 may be formed by a technique referred to as separation by implanted oxygen (SIMOX) in which oxygen or oxygen-containing ions are implanted into the hybrid substrate 30, as indicated diagrammatically by the single headed arrows 56, and then the hybrid substrate 30 is annealed under conditions that are capable of forming the buried insulating layer 52. The kinetic energy of the implanted ions 56 is selected such that the projected range in the depth or concentration profile falls proximate to the interface 35. The hybrid substrate 30 may be held at ambient temperature or at an elevated temperature during the implantation. The dose of the implanted ions 56 may be selected such that the buried insulating layer 52 comprises stoichiometric $SiO_2$. In a conventional high-dose SIMOX process, a conventional ion implanter is used to implant oxygen ions ($O^+$) at a kinetic energy of about 50 keV to about 250 keV and at a dose of about $4\times10^{17}$ $cm^{-2}$ to about $2\times10^{18}$ $cm^{-2}$ to form an as-implanted stoichiometric layer, after which a high temperature anneal repairs implantation damage in the constituent semiconductor material of the islands 45, 48 and converts the implanted oxygen into a buried oxide layer defining the buried insulator layer 52. The high temperature anneal may be performed at a temperature in the range of about 1100° C. to about 1350° C. in an oxidizing atmosphere including at least one oxygen-containing species and optionally diluted with one or more inert gases.

The resultant hybrid substrate 30, therefore, has the construction of a semiconductor-on-insulator (SOI) substrate. The islands 48 of semiconductor material and islands 45 of semiconductor material associated with semiconductor layer 24, which have substantially the same thickness but different crystal orientations, define device or active regions separated from the substrate 10 by the buried insulating layer 52. Each set of dielectric spacers 44, 46 extends from top surface 28 to the buried insulating layer 52, which laterally isolates adjacent islands 45, 48.

In a particular embodiment, the hybrid substrate 30 is compatible with CMOS device fabrication entailing formation of n-channel transistors or nFETs 96 (FIG. 15) using the semiconductor material of epitaxial islands 48 and p-channel transistors or pFETs 98 (FIG. 15) using the semiconductor material of the islands 45 of semiconductor material associated with semiconductor layer 24. As a result, both n-channel and p-channel transistors 96, 98 are disposed on the same substrate 30 with the carrier mobilities optimized by the different crystal orientations of the constituent semiconductor material in islands 45, 48, respectively. The transistors 96, 98 include various conventional features like source/drain regions, halo implants, gates, spacers on the gates, gate contacts, source/drain contacts, etc., formed by standard CMOS process steps understood by a person having ordinary skill in the art. The invention also contemplates that both n-channel and p-channel transistors 96, 98 may be formed in each of the different islands 45, 48 with the introduction of wells having an appropriate conductivity type.

In an alternative embodiment of the invention, a hybrid substrate may be fabricated such that a floating body of semiconductor material underlies each of the device regions or islands of semiconductor material of one of the different crystal orientations. The floating body may be used to independently change the threshold voltage of field effect transistors fabricated using these islands of semiconductor material. The floating body may also be used to add capacitance to the fabricated field effect transistors so that these devices are inherently less sensitive to alpha radiation particle errors and other radiation-induced effects. Radiation resistance may find applications in spacecraft, satellites and military electronics, where radiation can render certain types of systems inoperative.

Figure 8:
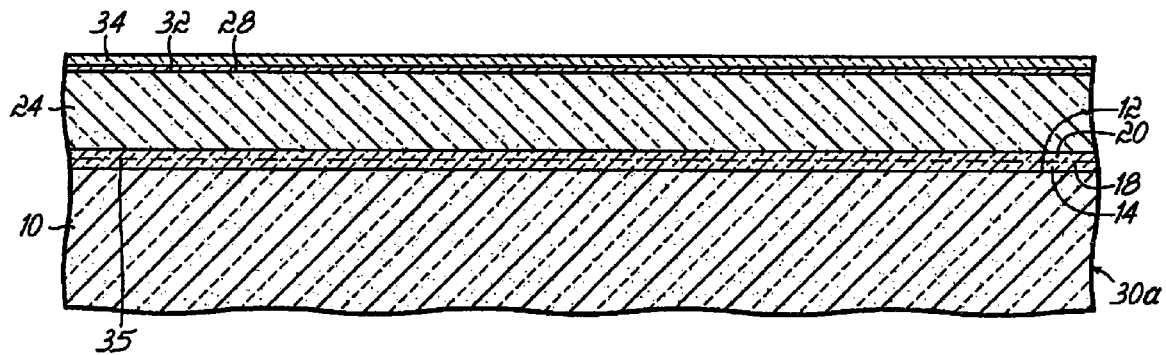
FIGS. 8-15 are diagrammatic cross-sectional views of a portion of a substrate at successive fabrication stages subsequent to FIG. 2 of a processing method in accordance with an alternative embodiment of the invention.

With reference to FIG. 8 in which like reference numerals refer to like features in FIG. 2 and at a subsequent fabrication stage in accordance with an alternative embodiment of the invention, the substrates 10, 20 are bonded together and cleaved to provide a hybrid substrate 30a comprising the semiconductor layer 24 of the second crystal orientation (j', k',l') is carried on the substrate 10 of the first crystal orientation (j,k,l). However, the contacting dielectric layers 14, 20 are retained in the construction of the hybrid substrate 30a in contrast to the construction of the hybrid substrate 30 as a buried insulating layer of the hybrid substrate 30a.

Figure 9:
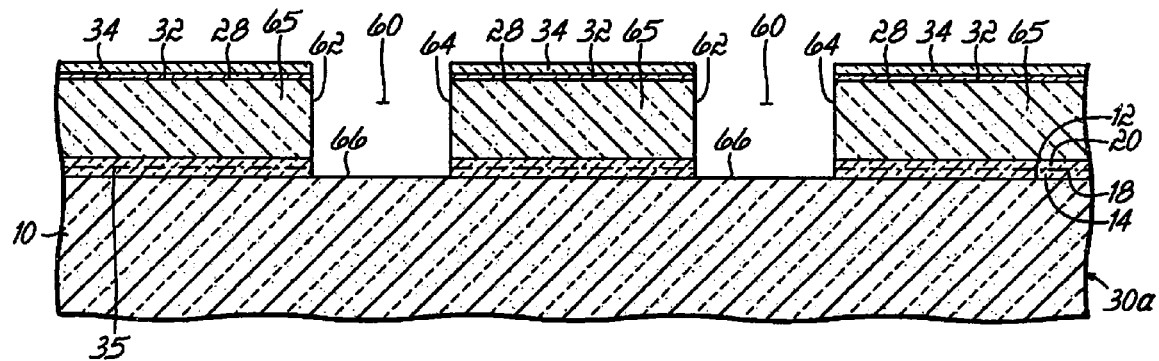

With reference to FIG. 9 in which like reference numerals refer to like features in FIG. 8 and at a subsequent fabrication stage, openings 60 are defined in the semiconductor material of semiconductor layer 24 by a conventional lithography and subtractive etching process, as described above with regard to openings 36 (FIG. 4). Each of the openings 60 defined in the semiconductor material of semiconductor layer 24 includes opposite sidewalls 62, 64 that extend into layer 24 to a bottom surface or base 66 that is at, or below, the interface 35 between the semiconductor layer 24 and the first substrate 10. The sidewalls 62, 64 are substantially mutually parallel and are oriented substantially perpendicular to the top surface 28 of semiconductor layer 24 and to the interface 35. At the conclusion of the conventional lithography and subtractive etching process, the semiconductor layer 24 includes a plurality of islands 65 of semiconductor material having the crystal orientation of the semiconductor material of substrate 16 (FIGS. 1, 2). The bottom surface 66 of each opening 60 lies at a greater depth than the contacting dielectric layers 14, 20.

Figure 10:
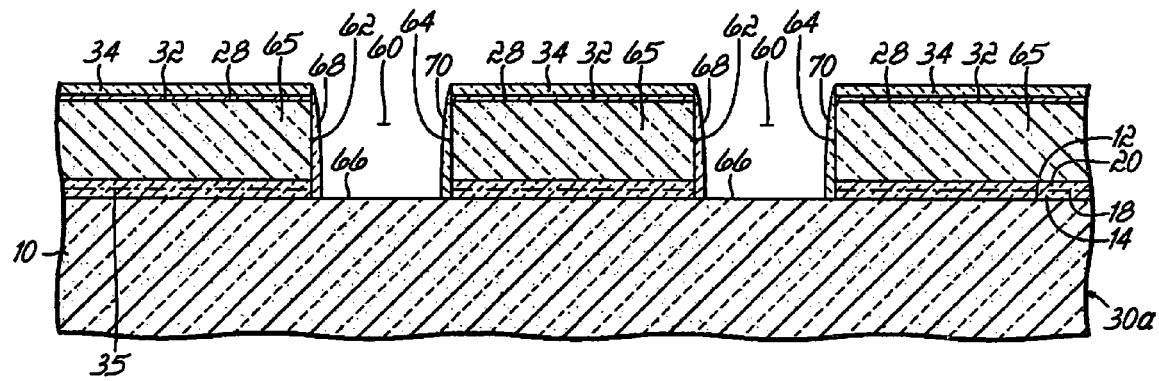

With reference to FIG. 10 in which like reference numerals refer to like features in FIG. 9 and at a subsequent fabrication stage, dielectric spacers 68, 70 are formed on the sidewalls 62, 64 of each opening 60, as described above with regard to dielectric spacers 44, 46 (FIG. 5).

Figure 11:
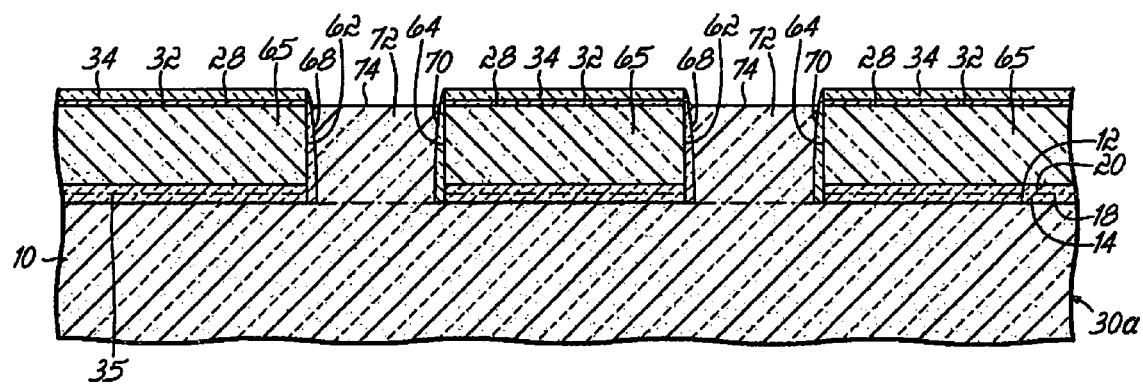

With reference to FIG. 11 in which like reference numerals refer to like features in FIG. 10 and at a subsequent fabrication stage, the openings 60 are filled with epitaxial islands 72 of semiconductor material, which are similar to epitaxial islands 48 (FIG. 6), to establish a top surface 74 approximately level with the top surface 28 of the semiconductor layer 24. The monocrystalline semiconductor material of the substrate 10 operates as a seed crystal of single crystal material that sets a crystallographic pattern for the deposited silicon of epitaxial islands 72. The pad layers 32, 34 and dielectric spacers 68, 70 on the sidewalls 62, 64 of each opening 60 isolate the epitaxial islands 72 such that the resulting crystal orientation of the islands 72 is unaffected during deposition and growth by the crystal orientation of the semiconductor layer 24. The epitaxial islands 72 may be deposited by an SEG process, as described above with regard to FIG. 6.

Figure 12:
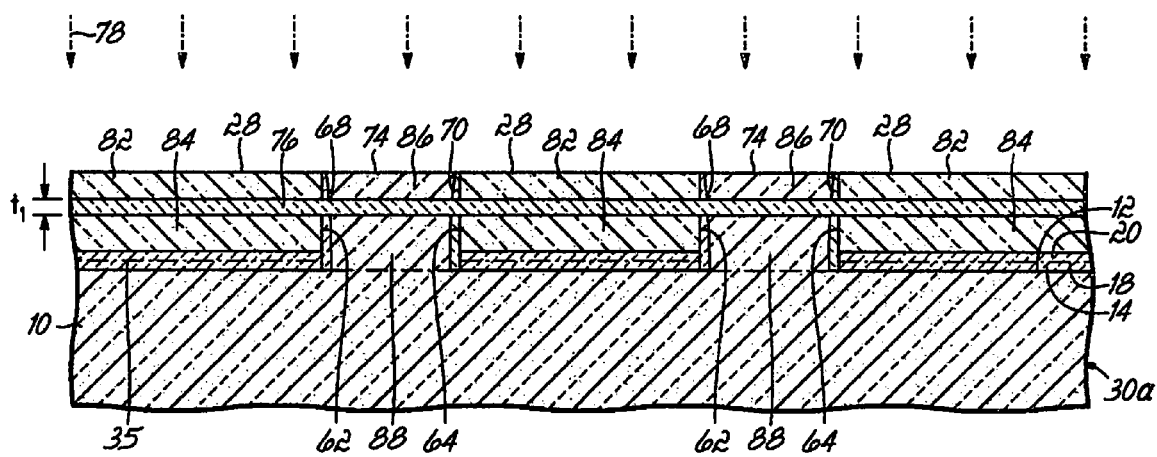

With reference to FIG. 12 in which like reference numerals refer to like features in FIG. 11 and at a subsequent fabrication stage, the top surface 74 of each of the epitaxial islands 72 and the top surface 28 of the islands 65 of semiconductor material associated with semiconductor layer 24 are planarized with a conventional planarization process, such as a CMP process, to be substantially coplanar, as described above with regard to FIG. 7. Each set of dielectric spacers 68, 70 operates to laterally isolate one of the epitaxial islands 72 from adjacent islands 65 of semiconductor material associated with semiconductor layer 24. The planarization, and optional etch process, removes the pad layers 32, 34 from the top surface 28 of islands 65.

The islands 65 have a crystal orientation determined by the crystal orientation (j',k',l') of the second substrate 16. Each of the islands 65 may have a crystal orientation (j',k',l') selected from (100), (110) and (111) crystal orientations common to monocrystalline silicon. The epitaxial islands 72 have a crystal orientation determined by the crystal orientation (j,k,l) of the first substrate 10. Each of the epitaxial islands 72 may have a crystal orientation (j,k,l) different from the crystal orientation (j',k',l') of islands 65 and selected from (100), (110) and (111) crystal orientations common to monocrystalline silicon.

A buried insulating layer 76, similar structurally to buried insulating layer 52 (FIG. 7), of a given thickness, $t_1$, is formed by, for example, the SIMOX process described above with regard to FIG. 7, at a depth between the substantially coplanar top surfaces 28, 74 and interface 35. If formed by a SIMOX process, the kinetic energy of the oxygen or oxygen-containing ions implanted into the hybrid substrate 30a, as indicated diagrammatically by the single headed arrows 78, is selected to position the concentration profile of implanted oxygen used to form buried insulator layer 76 at a shallower depth than the interface 35 (i.e., at a depth between interface 35 and top surface 28). The dose of the implanted oxygen or oxygen-containing ions may be selected such that the buried insulating layer 76, after the high temperature anneal, comprises stoichiometric $SiO_2$.

The buried insulating layer 76 divides each of the islands 65 into a device or active region 82 and a body region 84 that is electrically by layer 76 isolated from the active region 82. The active region 82 lies vertically between the buried insulating layer 76 and the top surface 28. The body region 84 is bounded by dielectric material of the buried insulating layer 76, the contacting dielectric layers 14, 20, and the dielectric spacers 68, 70. The buried insulating layer 76 also divides each of the epitaxial islands 72 into a device or active region 86 and a body region 88 that is electrically coupled with the semiconductor material of substrate 10, which now operates as a bulk or handle wafer. Each active region 86 is electrically isolated from the corresponding body region 88 by a portion of layer 76. The active region 86 is disposed vertically between the buried insulating layer 76 and the top surface 74.

The dielectric spacers 68, 70 extend from the top surface 28 to the buried insulator layer 76 and from the buried insulator layer 76 to the buried insulating layer defined by dielectric layers 14, 20. The dielectric spacers 68, 70 cooperate with the buried insulator layer 76 and the buried insulating layer defined by dielectric layers 14, 20 to electrically isolate each of the body regions 84 from the body regions 88, the active regions 82, 86, and the substrate 10. Consequently, the body regions 84 are electrically floating. The body regions 88 are at the electrical potential of substrate 10. Adjacent pairs of spacers 68, 70 also operate to vertically self-align each of the body regions 84 with one of the active regions 82 so that each active region 82 is registered with one of the body regions 84.

Figure 13:
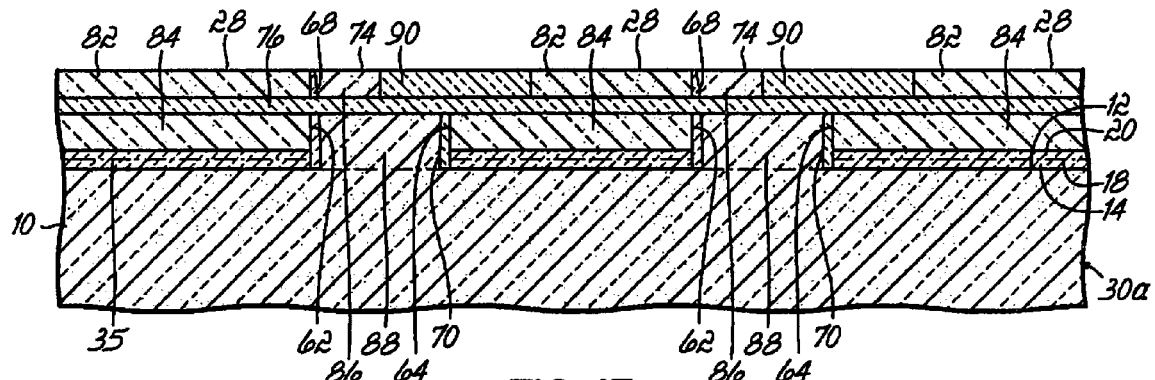

With reference to FIG. 13 in which like reference numerals refer to like features in FIG. 12 and at a subsequent fabrication stage, shallow trench isolation regions 90 are formed that extend to the depth of the buried insulating layer 76. The shallow trench isolation regions 90 may be formed by defining trenches in the islands 65, 72 with a conventional photolithography and etching process, performing a brief thermal oxidation, and then depositing a layer of dielectric to a thickness that is adequate to fill the trenches. The dielectric constituting the shallow trench isolation regions 90 may comprise silicon dioxide, such as tetraethylorthosilicate (TEOS) deposited by a LPCVD process, densified by a thermal anneal, and planarized, such as by a CMP process. The shallow trench isolation regions 90 are approximately co-planar with the top surfaces 28, 74 of the islands 65, 72.

Figure 14:
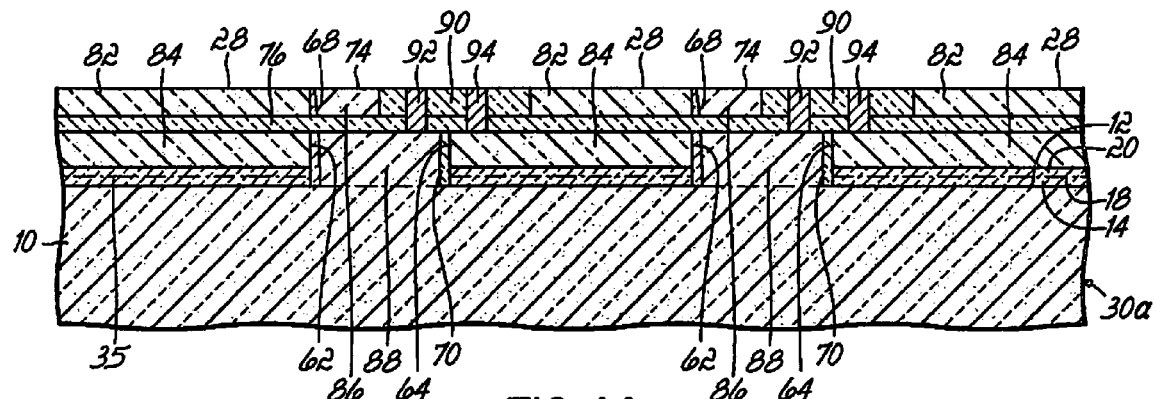

With reference to FIG. 14 in which like reference numerals refer to like features in FIG. 13 and at a subsequent fabrication stage, body contacts 92, 94 are formed in each of the shallow trench isolation regions 90 that extend through the buried insulating layer 76. The body contacts 92, 94 may be formed by defining vias at appropriate locations in each shallow trench isolation region 90 using a conventional photolithography and etching process and then filling the vias with a suitable conductor, as understood by a person having ordinary skill in the art. Each body contact 92 is electrically coupled with the body region 88 of one of the epitaxial islands 72 and handle wafer 80. Each body contact 94 is electrically coupled with the body region 88 of one of the islands 65.

The body contacts 92, 94 consist of an electrical conductor. Suitable conductors for the body contacts 92, 94 include, but are not limited to, doped polycrystalline silicon (polysilicon), aluminum (Al), copper (Cu), tungsten (W), silver (Ag), alloys of these metals, and other like metals. The conductor constituting the body contacts 92, 94 may be deposited by a conventional deposition process, such as CVD, plasma-enhanced CVD, an electrochemical process such as electroplating or electroless plating, physical vapor deposition (PVD), direct current (DC) or radio frequency (RF) sputtering, and the like. The formation of the body contacts 92, 94 may be coordinated in the process method such that the transistors 96, 98 are formed before the body contacts 92, 94.

An optional liner (not shown) may be applied to the sidewall of the vias containing the body contacts 92, 94 to separate the conductor from the dielectric material of the shallow trench isolation region 90 and buried insulator layer 52. The liner may comprise one or more layers of tantalum (Ta), titanium (Ti), tungsten (W), or nitrides of these metals and may be formed by a conventional deposition process, such as CVD, plasma-enhanced CVD, or PVD.

Figure 15:
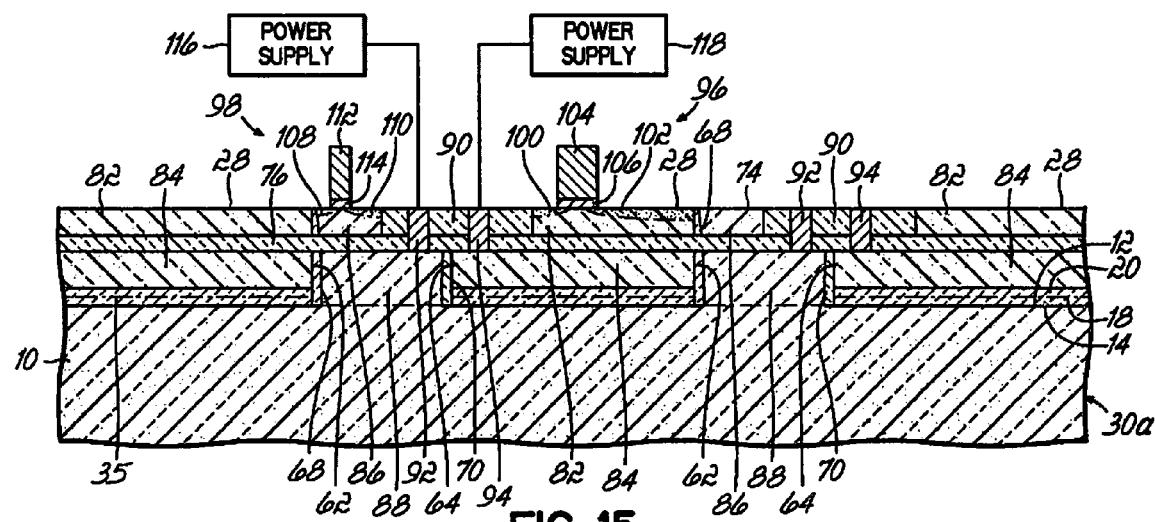

With reference to FIG. 15 in which like reference numerals refer to like features in FIG. 14 and at a subsequent fabrication stage, an n-channel transistor 98 is built using the active region 82 of one of the islands 65, and a p-channel transistor 96 is built using the active region 86 of one of the epitaxial islands 72 to define a CMOS device. The transistors 96, 98 are fabricated using standard CMOS processing steps known to a person having ordinary skill in the art.

The n-channel transistor 98 includes n-type diffusions in the active region 82 of island 65 representing a source region 100 and a drain region 102 that flank opposite sides of a channel region in the active region 82, a gate electrode 104 overlying the channel region, and a gate dielectric 106 electrically isolating the gate electrode 104 from the semiconductor material of island 65. The p-channel transistor 96 includes p-type diffusions in the active region 86 of epitaxial island 72 representing a source region 108 and a drain region 110 that flank opposite sides of a channel region in the active region 86, a gate electrode 112 overlying the channel region, and a gate dielectric 114 electrically isolating the gate electrode 112 from the semiconductor material of epitaxial island 72. Other structures (not shown), such as spacers and halo regions, may be included in the construction of the n-channel transistor 98 and the p-channel transistor 96.

The conductor used to form the gate electrodes 104, 112 may be, for example, doped polysilicon, silicide, metal, or any other appropriate material deposited by a CVD process, etc. The source and drain regions 100, 102 and the source and drain regions 108, 110 may be formed in the respective active regions 82, 86 by ion implantation of suitable dopant species having an appropriate conductivity type. The gate dielectrics 106, 114 may comprise any suitable dielectric or insulating material like silicon dioxide, silicon oxynitride, a high-k dielectric, or combinations of these materials. The dielectric material constituting dielectrics 106, 114 may have a thickness between about 1 nm and about 10 nm, and may be formed by thermal reaction of the semiconductor material of the respective active regions 82, 86 with a reactant, a CVD process, a PVD technique, or a combination thereof.

Each n-channel transistor 98 operates when a sufficient voltage greater than a characteristic threshold voltage is applied to the gate electrode 104. Applied voltages exceeding the threshold voltage generate a sufficient electric field across the channel region in active region 82 below the gate electrode 104 to form a conductive path in the constituent semiconductor material between the source and drain regions 100, 102 allowing current to flow therebetween. Similarly, each p-channel transistor 96 operates when a sufficient voltage greater than a characteristic threshold voltage is applied to the gate electrode 112. Applied voltages exceeding the threshold voltage generate a sufficient electric field across the channel region in the active region 86 below the gate electrode 112 to form a conductive path in the constituent semiconductor material between the source and drain regions 108, 110 allowing current to flow therebetween.

Each body contact 92 is electrically coupled with the body region 88 of one of the epitaxial islands 72 and the handle wafer 80 through that epitaxial island 72. The body region 88 of each epitaxial island 72 is directly beneath the respective active region 86 in which the source and drain regions 108, 110 and channel region of one of the p-channel transistors 96 are formed. The threshold voltage of the transistor 96 may be altered by applying a suitable bias voltage from a power supply 116 through the body contact 92 to the semiconductor material of the handle wafer 10.

Each body contact 94 is electrically coupled with the body region 84 of one of the islands 65, which defines a floating body of semiconductor material electrically isolated from surrounding structures. The body region 84 of each island 65 is directly beneath the respective active region 82 in which the source and drain regions 100, 102 and channel region of one of the n-channel transistors 98 are formed. The threshold voltage of the transistor 98 may be altered by applying a suitable bias voltage from a power supply 118 through the body contact 94 to the semiconductor material of the body region 84.

Because the body contacts 92, 94 can be independently biased, the threshold voltage of the n-channel transistor 98 can be varied independent of the threshold voltage for the p-channel transistor 96 and vice-versa. Alternatively, the threshold voltage for only one type of transistor 96, 98 may be adjusted by application of a bias voltage. If the contacting dielectric layers 14, 20 are sufficiently thin, the body region 84 of each island 65 may also be used as a capacitor structure contacted via body contact 94.

In an alternative embodiment of the invention, a hybrid substrate may be fabricated such that a floating body of semiconductor material underlies the active regions of semiconductor material of each of the different crystal orientations. The floating bodies may be used to independently change the threshold voltage of field effect transistors fabricated using these different active regions and to independently add capacitance to the fabricated field effect transistors.

Figure 16:
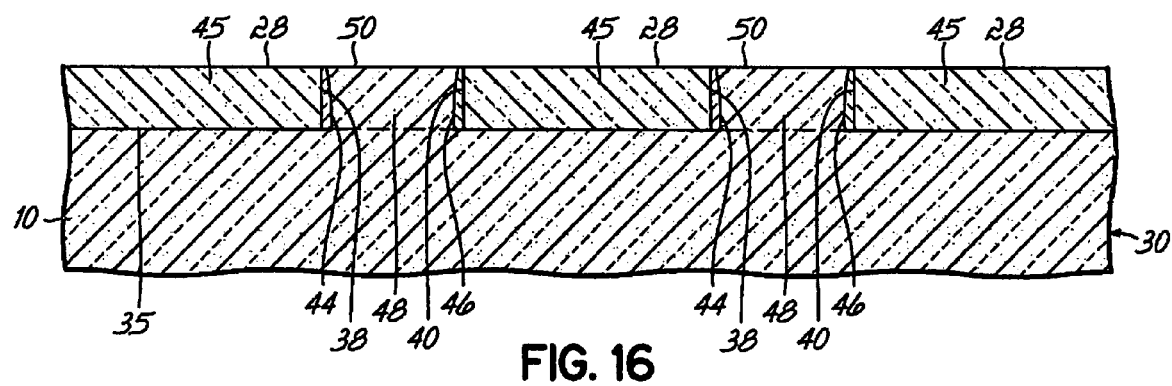
FIGS. 16-24 are diagrammatic cross-sectional views of a portion of a substrate at successive fabrication stages subsequent to FIG. 6 of a processing method in accordance with an alternative embodiment of the invention.

With reference to FIG. 16 in which like reference numerals refer to like features in FIG. 6 and at a subsequent fabrication stage, the pad layers 32, 34 of substrate 30 are removed from the top surface 28 of islands 45 and the top surface 28 is planarized, as described above with regard to FIG. 7. The crystal orientation of islands 45 is determined by the crystal orientation (j',k',l') of the second substrate 16. The crystal orientation of epitaxial islands 48 is determined by the crystal orientation (j,k,l) of the first substrate 10.

Figure 17:
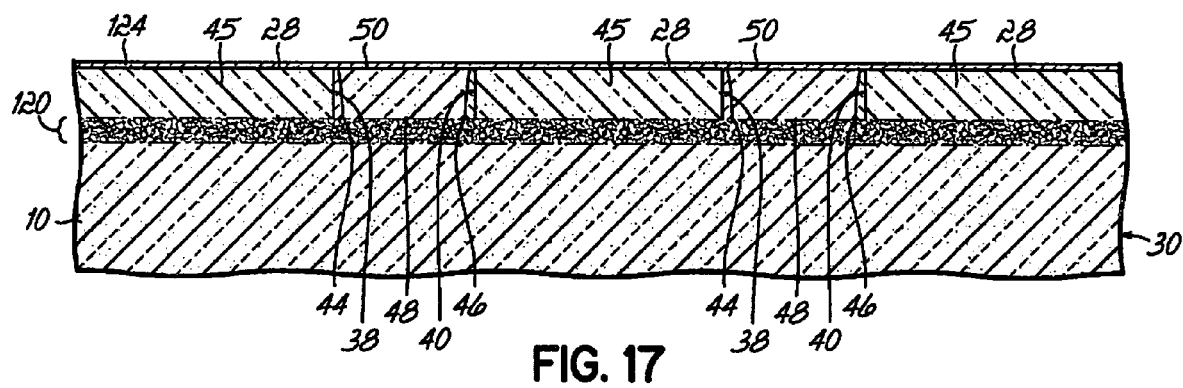

With reference to FIG. 17 in which like reference numerals refer to like features in FIG. 16 and at a subsequent fabrication stage, substrate 30 is ion implanted using a conventional ion implantation process with hydrogen ions, or other rare gas ions, of relatively low energy to create a shallow and narrow damaged region or band 120 that is similar to damaged band 22 (FIG. 1). Following a suitable thermal treatment, the damaged band 120 defines a cleaving plane, as described hereinabove with regard to FIG. 3. The top surface 50 of each epitaxial island 48 and the top surface 28 of each island 45 originating from the semiconductor layer 24 are covered by a relatively thin dielectric layer 122 of a dielectric material similar to insulating layers 12, 20 (FIG. 1).

Figure 18:
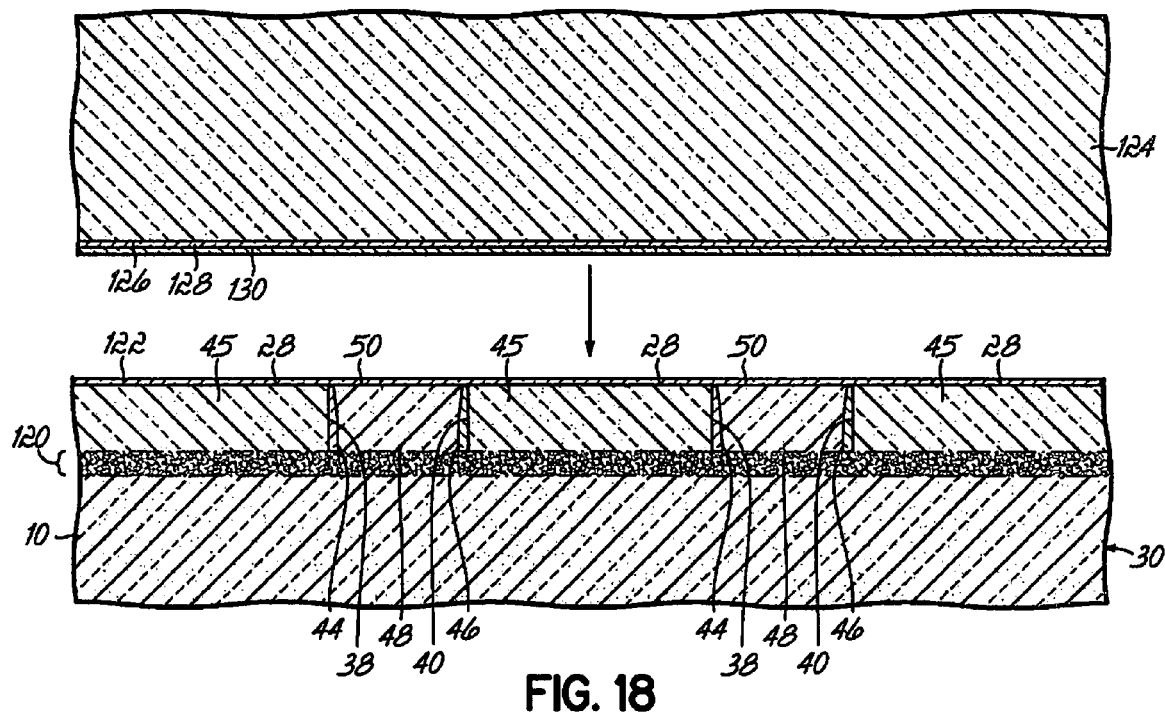

With reference to FIG. 18 in which like reference numerals refer to like features in FIG. 17 and at a subsequent fabrication stage, a handle substrate 124 similar to substrates 10, 16 (FIG. 1) includes a top surface 126 covered by a relatively thin dielectric layer 128 of a high-k dielectric material and a relatively thin dielectric layer 130 of a dielectric material that is similar to insulating layers 12, 20 (FIG. 1). The dielectric layer 128 of high-k dielectric material is disposed between the dielectric layer 130 and the handle substrate 124.

The dielectric layer 128 is made from a material having a high dielectric constant (high-k) in comparison with the dielectric constant of thermal silicon dioxide (e.g., greater than about 3.9). The high-k material constituting layer 128 can be a nitrided silicon oxide, silicon nitride, various metal oxides (e.g. aluminum oxide, hafnium oxide, zirconium oxide, and the like), certain insulating metal nitrides (e.g. aluminum nitride), or combinations of these candidate materials (e.g. laminates and composites). Such high-k dielectrics may be deposited over the semiconductor substrate, using a CVD process, a PVD process, atomic layer deposition (ALD), molecular beam epitaxy (MBE), or other deposition processes.

Figure 19:
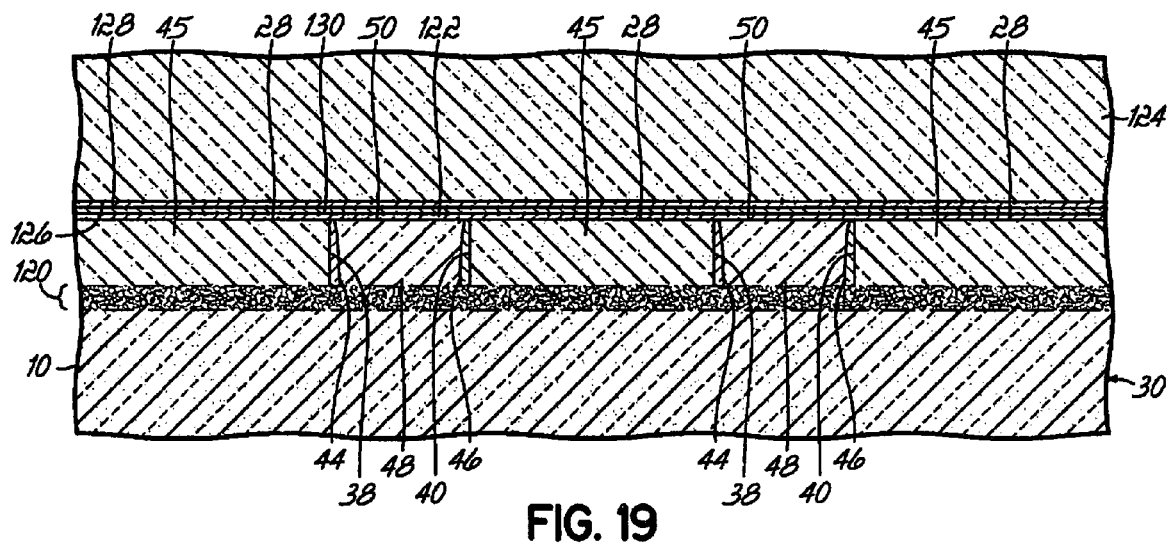

With reference to FIG. 19 in which like reference numerals refer to like features in FIG. 18 and at a subsequent fabrication stage, the substrates 30, 124 are manipulated to place the dielectric layers 122, 130 in a contacting relationship. The mutual bonding energy between the contacting dielectric layers 122, 130 is then increased to bond the substrates 30, 124 together, as described above with regard to FIG. 2.

Figure 20:
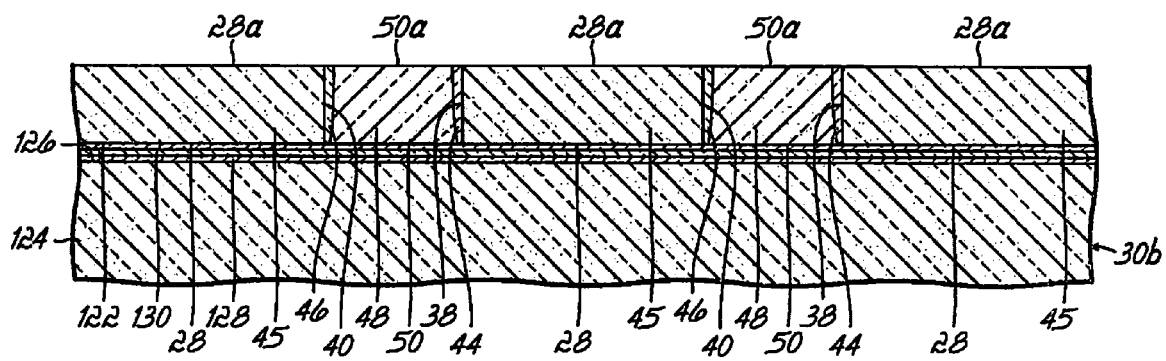

With reference to FIG. 20 in which like reference numerals refer to like features in FIG. 19 and at a subsequent fabrication stage, the bonded substrates 30a, 124 are thermally treated to cause separation along a cleaving plane defined generally by the damaged band 120, as described above with regard to damaged band 22 (FIG. 3). After cleaving, a hybrid substrate 30b, which is inverted in FIG. 20 as compared with FIG. 19, now includes a freshly-exposed top surface 50a for each epitaxial island 48 and a freshly-exposed top surface 28a for each island 45 originating from the semiconductor layer 24 along the cleaved surface. The newly-exposed top surfaces 50a, 28a are planarized and polished by, for example, a CMP process to be approximately flat, smooth, and co-planar.

Figure 21:
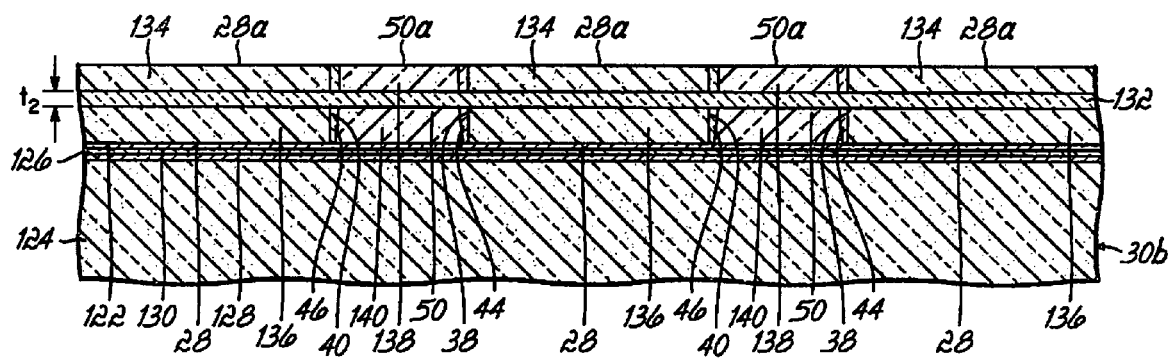

With reference to FIG. 21 in which like reference numerals refer to like features in FIG. 20 and at a subsequent fabrication stage, a buried insulating layer 132, which is structurally similar to buried insulating layers 52 (FIG. 7) and 76 (FIG. 12), of a given thickness, $t_2$, is formed by, for example, the SIMOX process described above with regard to FIG. 7. The kinetic energy of the oxygen or oxygen-containing ions implanted into the hybrid substrate 30b is selected to position the concentration profile of oxygen used to form buried insulator layer 76 at a shallower depth than the depth of the contacting dielectric layers 122, 130 (i.e., between the contacting dielectric layers 122, 130 and top surface 28a). The dose of the implanted oxygen or oxygen-containing ions may be selected such that the buried insulating layer 132, after the high temperature anneal, comprises stoichiometric $SiO_2$.

The buried insulating layer 132 divides each of the islands 45 into a device or active region 134 and a body region 136 that is electrically isolated by insulating layer 132 from the active region 134. The active region 134 lies vertically between the buried insulating layer 132 and the top surface 28a. The buried insulating layer 132 also divides each of the epitaxial islands 48 into a device or active region 138 and a body region 140. The active region 138 is electrically isolated from the body region 140 by layer 132. The active region 138 lies vertically between the buried insulating layer 132 and the top surface 50a. Each of the body regions 136, 140 is bounded by dielectric material of the buried insulating layer 132, the contacting dielectric layers 122, 130, and an adjacent pair of the dielectric spacers 44, 46.

The dielectric spacers 44, 46 extend from the top surface 28a to the buried insulating layer 132 and from the buried insulator layer 132 to the buried insulating layer defined by dielectric layers 122, 128, 130. As a consequence, the dielectric spacers 44, 46 cooperate with the buried insulator layer 132 and the buried insulating layer defined by dielectric layers 122, 128, 130 to electrically isolate each of the body regions 136 from the body regions 140, the active regions 134, 138, and the handle substrate 124. Adjacent pairs of the dielectric spacers 44, 46 also operate to vertically self-align each of the body regions 134 with one of the active regions 132 so that each active region 132 is registered with one of the body regions 134. Similarly, adjacent pairs of the dielectric spacers 44, 46 cooperate with the buried insulator layer 132 and the buried insulating layer defined by dielectric layers 122, 128, 130 to electrically isolate each of the body regions 140 from the body regions 136, the active regions 134, 138, and the handle substrate 124. The dielectric spacers 44, 46 also operate to vertically self-align each of the body regions 140 with one of the active regions 138 so that each active region 138 is registered with one of the body regions 140. Each of the body regions 134, 140 is electrically floating.

Figure 22:
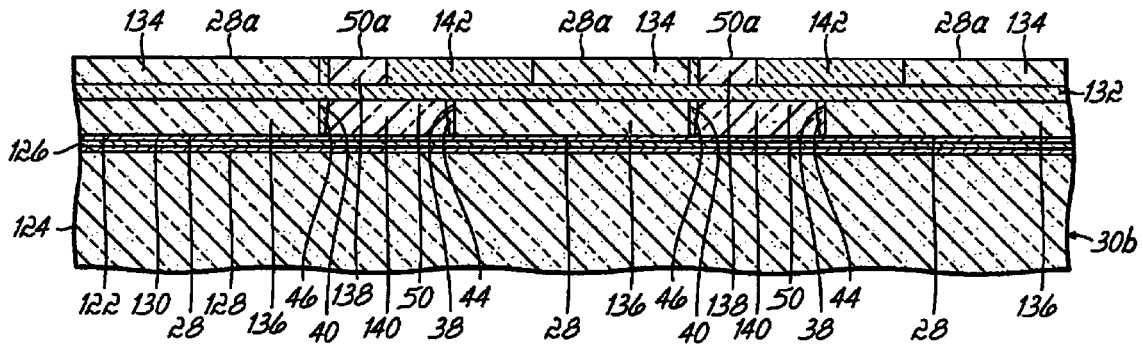

With reference to FIG. 22 in which like reference numerals refer to like features in FIG. 21 and at a subsequent fabrication stage, shallow trench isolation regions 142, which are structurally similar to shallow trench isolation regions 90 (FIG. 13), are formed that extend to the depth of the buried insulating layer 132, as described above with regard to FIG. 13.

Figure 23:
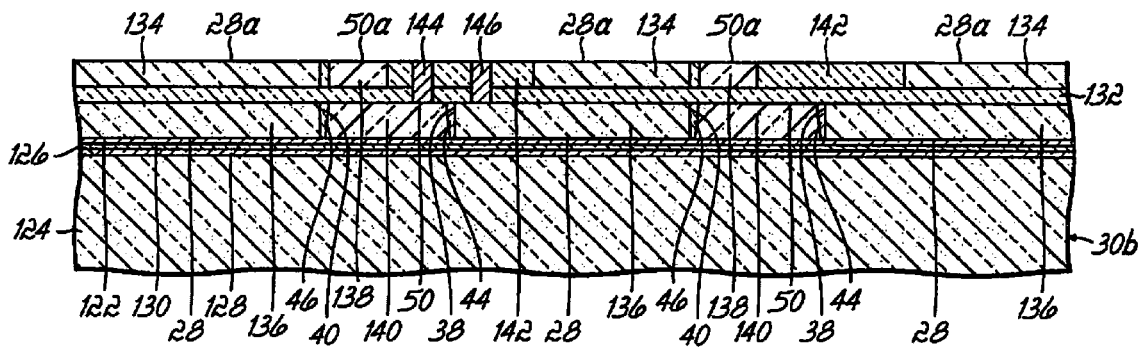

With reference to FIG. 23 in which like reference numerals refer to like features in FIG. 22 and at a subsequent fabrication stage, body contacts 144, 146, which are structurally similar to body contacts 92, 94 (FIG. 14), are formed in each of the shallow trench isolation regions 142. The body contacts 144, 146 extend through the buried insulating layer 132, as described above with regard to FIG. 19. Each body contact 144 is electrically coupled with the body region 140 of one of the epitaxial islands 48. Each body contact 146 is electrically coupled with the body region 136 of one of the islands 45.

Figure 24:
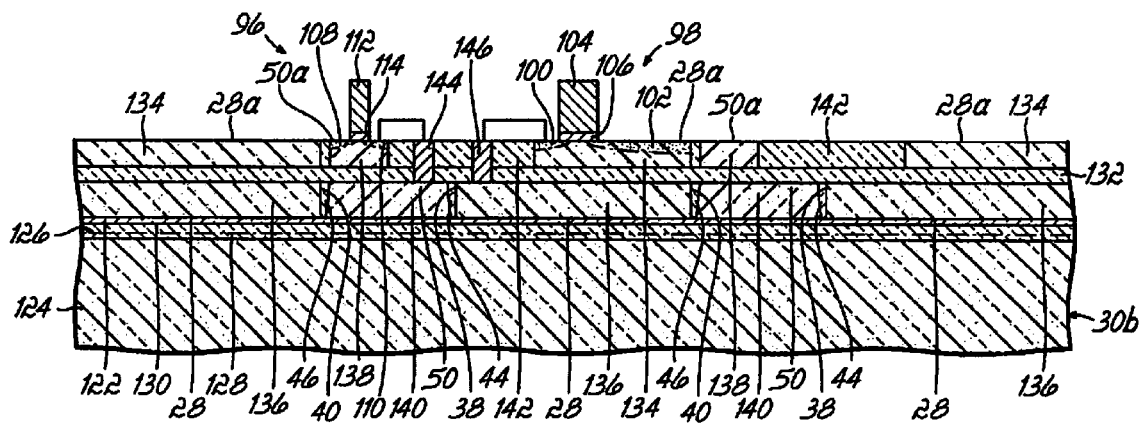

With reference to FIG. 24 in which like reference numerals refer to like features in FIG. 23 and at a subsequent fabrication stage, n-channel transistor 96 is built using the active region 134 of one of the islands 45 and p-channel transistor 98 is built using the active region 138 of one of the epitaxial islands 48 to define a CMOS device, as described above with regard to FIG. 15.

Each body contact 144 is electrically coupled with the body region 140 of one of the epitaxial islands 48. The body region 140 of each epitaxial island 48 is directly beneath the respective active region 138 in which the source and drain regions 108, 110 and channel region of one of the p-channel transistors 98 are formed. The threshold voltage of the transistor 98 may be altered by applying a suitable bias voltage from source region 100 (or drain region 102) through the body contact 144 to the semiconductor material of the body region 140.

Each body contact 146 is electrically coupled with the body region 136 of one of the islands 45, which defines a floating body of semiconductor material electrically isolated from surrounding structures. The body region 136 of each island 45 is directly beneath the respective active region 134 in which the source and drain regions 102, 104 and channel region of one of the n-channel transistors 96 are formed. The threshold voltage of the transistor 96 may be altered by applying a suitable bias voltage from drain region 110 (or source region 108) through the body contact 146 to the semiconductor material of the body region 136.

Because the body contacts 92, 94 can be independently biased, the threshold voltage of the n-channel transistor 96 can be varied independent of the threshold voltage for the p-channel transistor 98 and vice-versa. Alternatively, the threshold voltage for only one type of transistor 96, 98 may be adjusted by application of a bias voltage. If the contacting dielectric layers 122, 130 are sufficiently thin, the body region 136 of each island 45 may also be used as a capacitor structure contacted via body contact 146 or the body region 140 of each epitaxial island 48 may also be used as a capacitor structure contacted via body contact 144.

In an alternative embodiment of the invention, the dielectric layer 128 of a high-k dielectric material may be omitted from the construction of the hybrid substrate 30b. In another alternative embodiment of the invention, the hybrid substrate 30a (FIGS. 8-15) may be modified to include an insulating layer of a high-k dielectric material (similar to layer 128) contiguous with one of the dielectric layers 14, 20.

References herein to terms such as "vertical", "horizontal", etc. are made by way of example, and not by way of limitation, to establish a frame of reference. The term "horizontal" as used herein is defined as a plane parallel to a conventional plane of a semiconductor wafer or substrate, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the embodiments of the invention. The term "on" used in the context of two layers means at least some contact between the layers. The term "over" means two layers that are in close proximity, but possibly with one or more additional intervening layers such that contact is possible but not required. As used herein, neither "on" nor "over" implies any directionality.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the invention. It is also understood that features of the invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of forming a semiconductor structure, the method comprising:
   bonding a first dielectric layer carried on a first semiconductor layer of a first crystal orientation with a second dielectric layer carried on a second semiconductor layer of a second crystal orientation differing from the first crystal orientation;
   defining a plurality of openings each having sidewalls extending from a top surface of the first semiconductor layer through the first and second dielectric layers to the second semiconductor layer;
   applying dielectric regions to the sidewalls of each of the openings;
   epitaxially growing an island of semiconductor material having the second crystal orientation of the second semiconductor layer to fill each of the openings;
   forming an insulating layer at a depth that divides the first semiconductor layer into a plurality of device regions between the insulating layer and the top surface and a plurality of body regions between the insulating layer and the first and second dielectric layers such that each of the body regions is aligned with one of the device regions between an adjacent pair of the dielectric regions;
   forming a shallow trench isolation region extending from the top surface of the first semiconductor layer to the insulating layer; and
   forming a contact extending through the shallow trench isolation region and the insulating layer to one of the body regions.

2. The method of claim 1 wherein forming the insulating layer further comprises:
   implanting oxygen-containing ions into the epitaxial semiconductor material filling the openings and the first semiconductor layer to form an oxygen concentration profile; and
   heating the oxygen concentration profile, the first semiconductor layer, and the epitaxially grown islands at a high temperature to form the insulating layer comprising oxygen from the oxygen concentration profile and material from at least one of the epitaxially grown islands and first semiconductor layer.

3. The method of claim 1 further comprising:
   applying a layer of a dielectric material having a dielectric constant greater than about 3.9 between the first dielectric layer and the first semiconductor layer or between the second dielectric layer and the second semiconductor layer.

4. A method of forming a semiconductor structure using a semiconductor layer comprising a juxtaposed plurality of islands of first and second crystal orientations, the islands being substantially co-planar and of substantially equal thicknesses, and adjacent pairs of the islands separated by a respective one of a plurality of dielectric regions, the method comprising:
   bonding a first dielectric layer on the semiconductor layer with a second dielectric layer carried on a handle substrate;
   transferring the semiconductor layer to the handle substrate;
   forming an insulating layer that divides each of the islands into a device region between the insulating layer and a top surface of the transferred semiconductor layer and a body region between the insulating layer and the first and second dielectric layers such that each of the body regions is aligned with one of the device regions between an adjacent pair of the dielectric regions;
   forming a plurality of shallow trench isolation regions each from the top surface to the insulating layer;
   forming a first contact extending through one of the shallow trench isolation regions and the insulating layer to one of the body regions of one of the first crystal orientation; and
   forming a second contact extending through another of the shallow trench isolation regions and the insulating layer to one of the body regions of the second crystal orientation.

5. The method of claim 4 further comprising:
   applying a layer of a dielectric material having a dielectric constant greater than about 3.9 between the first dielectric layer and the semiconductor layer or between the second dielectric layer and the handle substrate.

6. The method of claim 4 wherein transferring the semiconductor layer to the handle substrate further comprises:
   separating the semiconductor layer from another handle substrate by cleaving along a cleavage plane.

7. The method of claim 4 wherein forming the insulating layer further comprises:
   implanting oxygen-containing ions into the transferred semiconductor layer to form an oxygen concentration profile; and
   heating the oxygen concentration profile and the semiconductor layer at a high temperature to form the insulating layer comprising oxygen from the oxygen concentration profile and material from the transferred semiconductor layer.

* * * * *

UNITED STATES PATENT AND TRADEMARK OFFICE
CERTIFICATE OF CORRECTION

| | | |
|---|---|---|
| PATENT NO. | : 7,651,902 B2 | Page 1 of 1 |
| APPLICATION NO. | : 11/737989 | |
| DATED | : January 26, 2010 | |
| INVENTOR(S) | : Cannon | |

It is certified that error appears in the above-identified patent and that said Letters Patent is hereby corrected as shown below:

On the cover page,

[*] Notice: Subject to any disclaimer, the term of this patent is extended or adjusted under 35 USC 154(b) by 73 days.

Delete the phrase "by 73 days" and insert -- by 165 days --

Signed and Sealed this

Tenth Day of August, 2010

David J. Kappos
*Director of the United States Patent and Trademark Office*